Dec. 17, 1957

W. SHOCKLEY

METHOD OF FABRICATING SEMICONDUCTOR SIGNAL TRANSLATING DEVICES

Filed Nov. 18, 1953

2,816,847

INVENTOR
W. SHOCKLEY

BY [signature]

ATTORNEY

United States Patent Office 2,816,847

Patented Dec. 17, 1957

2,816,847

METHOD OF FABRICATING SEMICONDUCTOR SIGNAL TRANSLATING DEVICES

William Shockley, Madison, N. J., assignor to Bell Telephone Laboratories, Incorporated, New York, N. Y., a corporation of New York Application November 18, 1953, Serial No. 392,971

2 Claims. (Cl. 148—1.5)

Figure 1:
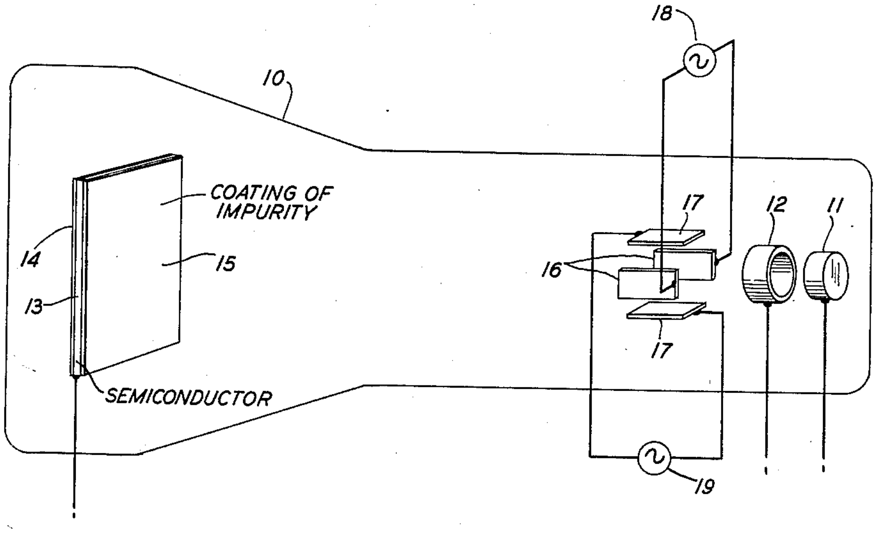

This invention relates to semiconductor signal translating devices and more particularly to methods of fabricating semiconductive bodies for such devices.

In a number of translating devices, such as transistors of the types disclosed in Patent 2,569,347 granted September 25, 1951 to W. Shockley and in the application Serial No. 317,883, filed October 31, 1952, now U. S. Patent No. 2,764,642, of W. Shockley, the semiconductive body, for example of germanium or silicon, includes two or more contiguous zones or regions of opposite conductivity types. That is one zone may be of N conductivity type and a contiguous one of P type, the two defining a junction or barrier. Operation of such devices entails flow, diffusion or drift, of electrical carriers, that is holes or electrons or both, in proximity to or across one or more of the junctions.

A characteristic of particular moment in semiconductor devices is the transit time of the carriers. In many devices a practical upper frequency limit is determined by the transit time, the relationship being an inverse one, with the maximum frequency approximately equal to the reciprocal of the transit time. The transit time is dependent upon the electric field and the path length. Thus, in a number of semiconductor devices, extremely close spacing of the electrodes and more particularly of two zones of one conductivity type on opposite sides of a zone of the opposite conductivity type is a desideratum.

One object of this invention is to facilitate the fabrication of translating devices having one or more PN junctions therein.

Another object of this invention is to enable the fabrication of semiconductive bodies having therein a series of closely adjacent zones, contiguous zones being of opposite conductivity types.

In accordance with one feature of this invention, in the fabrication of a semiconductive body for signal translating devices, a coating containing a conductivity-type determining impurity, that is a donor or acceptor, is applied to a body of one conductivity type. Then an electron beam is directed against the coating with sufficient energy to effect diffusion of the impurity into, or alloyage thereof with the body. The beam is deflected to trace a path of prescribed configuration on the body thereby to produce the diffusion or alloyage at the regions of incidence of the beam. As the beam may be of fine traverse dimensions and its trace controlled accurately, extremely narrow zones of conductivity type opposite that of the body and closely spaced can be produced.

In one illustrative embodiment of this invention, a coating containing or consisting of a donor material, for example antimony, is applied to one face of a germanium or silicon body of P conductivity type and the electron beam is directed against this face as described above. The beam, at its points of incidence, raises the temperature of the body and coating sufficiently to effect diffusion of the antimony into the body whereby those regions into which diffusion occurs are converted to N conductivity type. Following cooling of the body, the coated face may be abraded or etched to remove the remaining antimony. Thus, there are produced in the body N and P type zones of prescribed configuration and orientation.

In another illustrative embodiment of this invention, a coating of indium is applied to one face of an N type silicon or germanium body and the electron beam is directed against this face with sufficient energy to raise the points of incidence to somewhat above the eutectic temperature of indium and the semiconductor whereby alloyage of the acceptor and semiconductor occurs. Upon cooling of the heated regions, recrystallization of the molten material obtains and P type zones are produced in the N type body, the configuration and orientation of the P zones being in accordance with the trace of the beam upon the coating. Indium on the face of the body and between the zones is removed as by abrasion or etching.

Although antimony and indium have been mentioned specifically, other donors such as arsenic and phosphorus, and other acceptors such as aluminum, gallium and copper, may be used. Also diffusion or alloyage followed by recrystallization may be effected with either donors or acceptors and with either N or P conductivity type semiconductive material. Also, although the significant impurity may be coated as such upon the semiconductor, the coating may be in the form of an alloy of the impurity and the semiconductor or an alloy of the impurity in an inert carrier. For example, arsenic-germanium material, which is N type, may be used as a coating on a P type germanium body or a coating of gallium-germanium, which is P type, may be applied to an N type body.

The coatings may be applied to the body in a variety of ways, for example by electroplating or vapor deposition.

Figure 2:
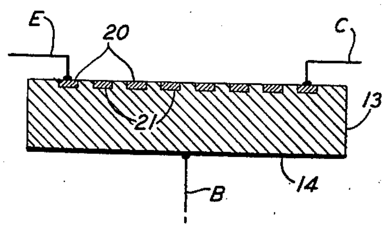
Figure 3:
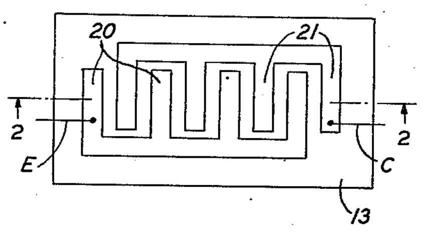
Figure 4:
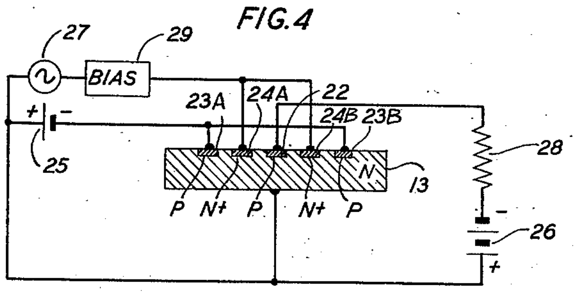

The invention and the above noted and other features thereof will be understood more clearly and fully from the following detailed description with reference to the accompanying drawing, in which:

Fig. 1 portrays diagrammatically apparatus of one form which may be utilized in practicing the methods of this invention;

Figs. 2 and 3 are section and plan views respectively of an illustrative signal translating device constructed in accordance with this invention; and Fig. 4 is in part a circuit diagram and in part a sectional view portraying another translating device illustrative of this invention.

Referring now to the drawing, the apparatus illustrated in Fig. 1 comprises an enclosing vessel 10, preferably highly evacuated, having at one end thereof an electron gun for producing a concentrated electron beam. The gun may be of any one of a variety of known constructions and includes a cathode 11 and a concentrating and accelerating system represented by the cylindrical electrode 12. At the other end of the vessel 10 is a target composed of a wafer 13 of semiconductive material, a metallic electrode 14 on the face of the wafer remote from the gun and a coating 15 of a significant impurity upon the face of the wafer toward the electron gun.

The trace of the beam upon the target is determinable by appropriate potentials applied between deflector plates 16 and 17 from sources 18 and 19 respectively.

In the fabrication of semiconductor bodies in accordance with this invention, the electron beam from the gun is directed against the target with sufficient energy to raise the area of impingement to a prescribed temperature and is deflected to trace a path of preassigned configuration over the impurity coated face of the target. The energy is controllable, of course, through the accelerating potential effective upon the beam as derived from biases upon either or both of the electrode 12 and the target. The heating of the target at the areas of beam incidence effects diffusion of the impurity into the semiconductive wafer or alloyage of the semiconductor and impurity whereby zones of conductivity or conductivity type different from that of the bulk of the wafer are produced, these zones being of the same configuration as the beam trace.

As one example, the wafer 13 may be of P conductivity type germanium or silicon and the coating 15 may be of a donor impurity such as antimony. The diffusion constant of antimony into germanium is about $10^{-10}$ cm.$^2$/sec./ at 880° C.; the diffusion constant of antimony into silicon is about $10^{-13}$ cm.$^2$/sec./ at 1000° C. Thus, by control of the time of incidence of the beam upon the target, the depth of the zones produced in the wafer may be made of any desired value. Also, of course, this dimension may be controlled by adjusting the beam energy thereby to determine the temperature of the irradiated portions of the target. In general, the higher the temperature, the greater the depth of diffusion in a given time.

As another example, the wafer 13 may be of N conductivity type germanium or silicon and the coating 15 may be of an acceptor impurity such as indium or aluminum. When the semiconductor-acceptor combination is heated to the eutectic temperature, the two constituents alloy and upon recrystallization zones of conductivity or conductivity type different from that of the bulk of the wafer are produced therein, at the areas of incidence of the electron beam. The eutectic temperature for germanium and indium is 156° C.; for silicon and aluminum it is 575° C.

It will be appreciated that extremely fine traces, and, hence, zones of very narrow width and close spacing can be produced. As the heating due to the beam is localized, the zones can be formed without detriment to the adjacent regions of the wafer, that is without substantial degradation of such electrical characteristics as the carrier lifetimes, and other effects associated with heating of semiconductive bodies as a whole. The process provides facile controls whereby zones of accurately prescribed dimensions, spacing and configuration are readily realized.

Figs. 2 and 3 depict a junction transistor including a semiconductive wafer fabricated in accordance with this invention. The wafer 13 has on one face thereof a metallic coating 14 constituting the base. In the opposite face are two multi-fingered zones 20 and 21 of conductivity type opposite that of the bulk of the wafer, produced in the manner described hereinabove and constituting the emitter and collector zones respectively. As shown clearly in Fig. 3, the fingers of the two zones 20 and 21 are in parallel alternate relation. As is evident, they may be closely and accurately spaced. Hence, very short and uniform carrier transit times are obtained so that high frequency operation and uniform and prescribed performance characteristics are realized. Further, although for purposes of illustration a relatively small number of fingers of substantial width have been shown in Figs. 2 and 3, it will be understood that a large number of narrow fingers can be provided per unit area.

Fig. 4 portrays a translating device of the general type disclosed in the application of W. Shockley identified hereinabove, and illustrative of another embodiment of this invention. The semiconductive wafer 13 of one conductivity type, for example N type as indicated in the drawing, has in one face portion thereof three zones 22, 23A and 23B of the opposite conductivity type and two additional zones 24A and 24B of the same type but higher conductivity than the bulk of the wafer. The zone 22 is designated the drain, the zones 23A and 23B the source and the zones 24A and 24B the gate. As shown in the drawing, the gate zones 24 advantageously are spaced equally from the drain zone 22 and the two source zones 23A and 23B are equally spaced from the adjacent gate zone 24A and 24B, respectively. The several zones are produced by alloyage or diffusion under electron bombardment in the manner described hereinabove, an acceptor impurity being used to produce the P type zones 22, 23A and 23B and a donor being employed to produce the gate zones 24A and 24B. Zones of very narrow width can be produced by vapor depositing the impurities upon the wafer 13 through fine slits in a mask or masks. As in the case of the device represented in Figs. 2 and 3, in that portrayed in Fig. 4, very close and accurate spacing of the several zones may be attained.

In operation of the device of Fig. 4, both the source zones 23A, 23B and the drain zone 22 are biased in the reverse direction relative to the bulk of the body 13, as by the batteries 25 and 26, whereby space charge regions extending from the drain to the source are established. The drain bias is substantially greater than that upon the source, so that majority carriers, holes when the zones are of the conductivity type indicated in the drawing, are drawn from the source zones 23A and 23B, traverse the space charge region and flow to the drain. This flow is controlled in accordance with signals, as from a source 27, applied between the gate and the source. Amplified replicas of the signals are obtained at a load, represented by the resistor 28. Because of the higher conductivity of the gate zones 24A and 24B, flow of carriers therefrom is substantially minimized. The gate may be appropriately biased, as by a source 29, to further suppress such emission.

Although in the particular embodiments described herein above the zones produced by electron bombardment have been illustrated as linear and parallel, they may be of other configuration and orientation. For example, they may be circular and concentric. Also, it will be understood that the embodiments shown and described are but illustrative and that various modifications may be made therein without departing from the scope and spirit of this invention.

What is claimed is:

1. The method of producing a semiconductive body having therein a zone of conductivity type opposite that of the bulk of the body which comprises applying to one face of a body of semiconductive material taken from the group consisting of germanium and silicon of one conductivity type a coating of a conductivity-type determining impurity capable of altering the conductivity type of said material by diffusion of the impurity into the material, directing an electron beam against said coating with sufficient intensity to effect diffusion of said impurity into said material, varying the direction of said beam to scan a path of preassigned configuration on said face, cooling said body and coating, and removing from said face the impurity outside said path.

2. The method of producing a semiconductive body having therein a zone of conductivity type opposite that of the bulk of the body which comprises applying to one face of a body of semiconductive material taken from the group consisting of germanium and silicon a coating of a conductivity-type determining impurity characteristic of the opposite conductivity type, directing an electron beam against said coating with sufficient energy to raise the area of incidence to the alloying temperature of said material and impurity, varying the direction of said beam to trace a path of prescribed configuration over said coating, cooling said body and coating, and removing the impurity from the portions of said face outside said path.

References Cited in the file of this patent

UNITED STATES PATENTS

| | | |
|---|---|---|
| 2,267,752 | Ruska et al. | Dec. 30, 1941 |
| 2,428,868 | Dimmick | Oct. 14, 1947 |
| 2,644,852 | Dunlap Jr. | July 7, 1953 |